United States Patent
Riley et al.

(10) Patent No.: US 9,224,656 B2
(45) Date of Patent: Dec. 29, 2015

(54) METHOD OF CMOS MANUFACTURING UTILIZING MULTI-LAYER EPITAXIAL HARDMASK FILMS FOR IMPROVED GATE SPACER CONTROL

(71) Applicant: Texas Instruments Incorporated, Dallas, TX (US)

(72) Inventors: Deborah Jean Riley, Murphy, TX (US); Seung-Chul Song, Dallas, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 13/950,909

(22) Filed: Jul. 25, 2013

(65) Prior Publication Data

US 2015/0031178 A1 Jan. 29, 2015

(51) Int. Cl.
*H01L 21/8238* (2006.01)

(52) U.S. Cl.
CPC .. *H01L 21/823807* (2013.01); *H01L 21/82385* (2013.01); *H01L 21/823814* (2013.01); *H01L 21/823864* (2013.01)

(58) Field of Classification Search
USPC ......... 438/197, 199, 231, 300, 305, 514, 530, 438/589
See application file for complete search history.

(56) References Cited

U.S. PATENT DOCUMENTS

| 2009/0001420 A1* | 1/2009 | Matsumoto | 257/190 |
| 2011/0201164 A1* | 8/2011 | Chung | H01L 21/823807 438/229 |
| 2014/0199837 A1* | 7/2014 | Hung | H01L 21/76816 438/675 |

* cited by examiner

*Primary Examiner* — Fernando L Toledo
*Assistant Examiner* — Lawrence-Linh T Nguyen
(74) *Attorney, Agent, or Firm* — Jacqueline J. Garner; Frank D. Cimino

(57) ABSTRACT

An integrated circuit containing PMOS transistors may be formed by forming a dual layer hard mask. A first layer of the hard mask is carbon-containing silicon nitride formed using a hydrocarbon reagent. A second layer of the hard mask is chlorine-containing silicon nitride formed on the first layer using a chlorinated silane reagent. After SiGe epitaxial source/drain regions are formed, the hard mask is removed using a wet etch which removes the second layer at a rate at least three times faster than the first layer.

19 Claims, 8 Drawing Sheets

US 9,224,656 B2

METHOD OF CMOS MANUFACTURING UTILIZING MULTI-LAYER EPITAXIAL HARDMASK FILMS FOR IMPROVED GATE SPACER CONTROL

FIELD OF THE INVENTION

This invention relates to the field of integrated circuits. More particularly, this invention relates to metal oxide semiconductor (MOS) transistors in integrated circuits.

BACKGROUND OF THE INVENTION

An integrated circuit containing p-channel metal oxide semiconductor (PMOS) transistors and n-channel metal oxide semiconductor (NMOS) transistors may be formed with silicon-germanium (SiGe) epitaxial source/drain regions in the PMOS transistors. An hard mask containing silicon nitride may be used to block the SiGe epitaxial material from the NMOS transistors. It may be desirable to form a uniform thin hard mask to maintain lateral separation between the SiGe epitaxial source/drain and the gate below a maximum allowable distance and with a desired uniformity. It may further be desirable to remove the hard mask without damaging an underlying gate offset spacer of silicon nitride. Forming the hard mask so as to simultaneously satisfy these criteria has been problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing PMOS transistors may be formed by forming a dual layer hard mask. A first layer of the hard mask is carbon-containing silicon nitride formed using a hydrocarbon reagent. A second layer of the hard mask is chlorine-containing silicon nitride formed on the first layer using a chlorinated silane reagent. After SiGe epitaxial source/drain regions are formed, the hard mask is removed using a wet etch which removes the second layer at a rate at least three times faster than the first layer.

DETAILED DESCRIPTION OF EXAMPLE EMBODIMENTS

The following co-pending patent application is related and hereby incorporated by reference: U.S. patent application Ser. No. 13/950,842.

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit containing PMOS transistors and NMOS transistors may be formed by forming a dual layer hard mask. A first layer of the hard mask is carbon-containing silicon nitride formed using a hydrocarbon reagent. A second layer of the hard mask is chlorine-containing silicon nitride formed on the first layer using a chlorinated silane reagent. After SiGe epitaxial source/drain regions are formed, the hard mask is removed using a wet etch which removes the second layer at a rate at least three times faster than the first layer. The dual layer hard mask may be used to form SiGe epitaxial source/drain regions in low-voltage PMOS transistors in logic circuits and/or high-voltage PMOS transistors in input/output (I/O) circuits.

Figure 1A:
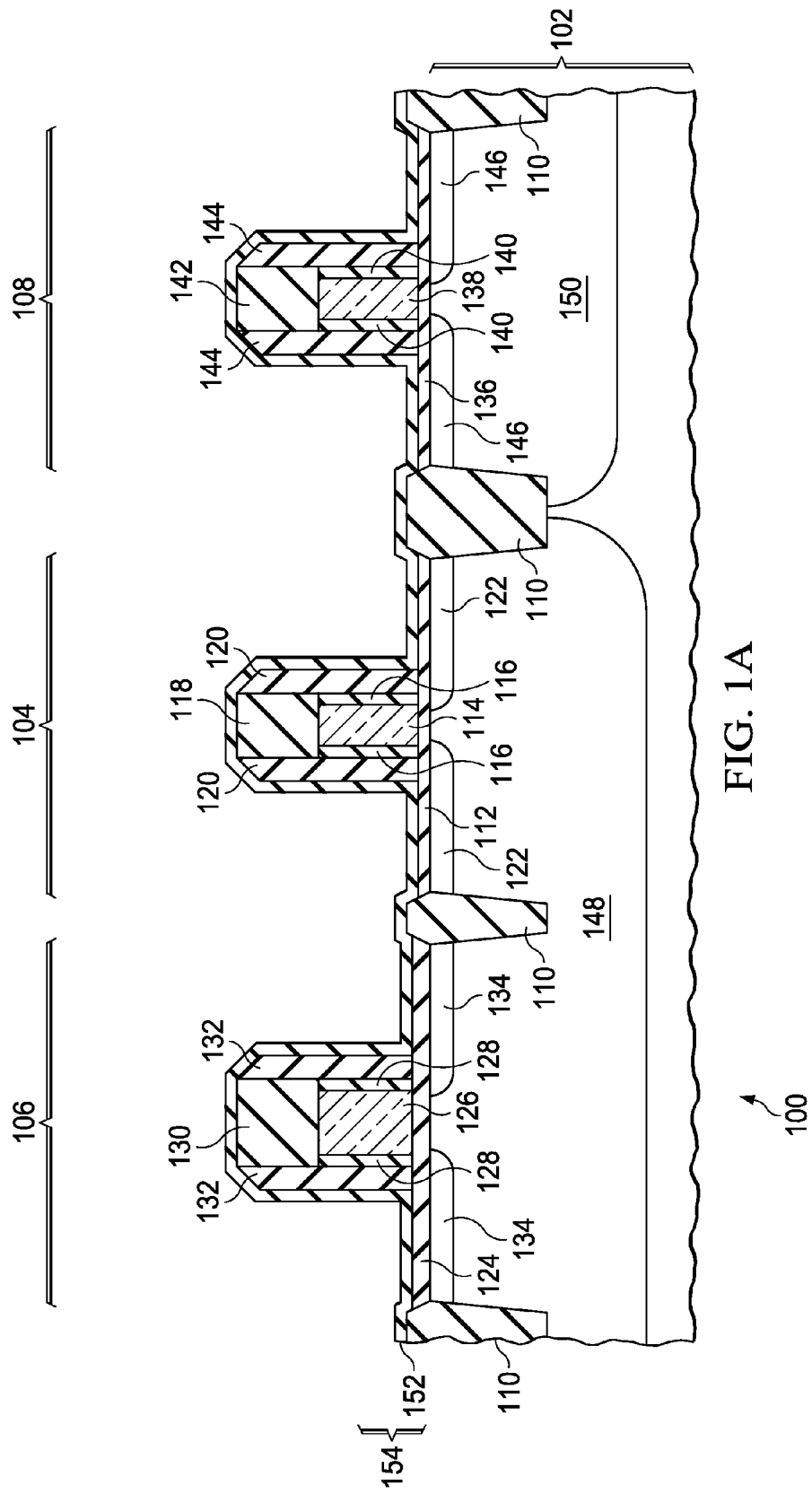
FIG. 1A through FIG. 1H are cross sections of an integrated circuit formed using an exemplary dual layer hard mask, depicted in successive stages of fabrication.

FIG. 1A through FIG. 1H are cross sections of an integrated circuit formed using an exemplary dual layer hard mask, depicted in successive stages of fabrication. Referring to FIG. 1A, the integrated circuit 100 is formed in and on a substrate 102 such as a single crystal silicon wafer, a silicon-on-insulator (SOI) wafer, a hybrid orientation technology (HOT) wafer with regions of different crystal orientations, or other substrate appropriate for fabrication of the integrated circuit 100. The integrated circuit 100 includes an area for a low-voltage PMOS transistor 104, a high-voltage PMOS transistor 106 and a low-voltage NMOS transistor 108. The low-voltage PMOS transistor 104 and the low-voltage NMOS transistor 108 may be in, for example, a logic circuit or a static random access memory (SRAM) cell. The high-voltage PMOS transistor 106 may be in, for example, an I/O circuit. The low-voltage PMOS transistor 104, the high-voltage PMOS transistor 106 and the low-voltage NMOS transistor 108 are laterally separated by field oxide 110 formed at a top surface of the substrate 102, for example using a shallow trench isolation (STI) process.

The low-voltage PMOS transistor 104 includes a gate dielectric layer 112 formed on the top surface of the substrate 102, a gate 114 formed on the gate dielectric layer 112, a gate hard mask 118 on the gate 114, gate oxidation 116 formed on lateral surfaces of the gate 114, and gate offset spacers 120 formed on lateral surfaces of the gate oxidation 116 and the gate hard mask 118. P-channel lightly doped drain (PLDD) regions 122 are formed in the substrate 102 adjacent to the gate 114 by implanting p-type dopants such as boron and co-implant species such as carbon and fluorine, followed by annealing the substrate 102.

The high-voltage PMOS transistor 106 includes a gate dielectric layer 124, which is at least 30 percent thicker than the gate dielectric layer 112 of the low-voltage PMOS transistor 104, formed on the top surface of the substrate 102. The high-voltage PMOS transistor 106 includes a gate 126, which has a gate length which is at least 30 percent longer than a gate length of the gate 114 of the low-voltage PMOS transistor 104, formed on the gate dielectric layer 124. The high-voltage PMOS transistor 106 includes a gate hard mask 130 on the gate 126, gate oxidation 128 formed on lateral surfaces of the gate 126, and gate offset spacers 132 formed on lateral surfaces of the gate oxidation 128 and the gate hard mask 130.

PLDD regions 134 are formed in the substrate 102 adjacent to the gate 126 by implanting p-type dopants and co-implant species, followed by annealing the substrate 102.

The low-voltage NMOS transistor 108 includes a gate dielectric layer 136 formed on the top surface of the substrate 102. The low-voltage NMOS transistor 108 includes a gate 138 formed on the gate dielectric layer 136. The low-voltage NMOS transistor 108 includes a gate hard mask 142 on the gate 138. The low-voltage NMOS transistor 108 includes gate oxidation 140 formed on lateral surfaces of the gate 138, and gate offset spacers 144 formed on lateral surfaces of the gate oxidation 140 and the gate hard mask 142. N-channel lightly doped drain (NLDD) regions 146 are formed in the substrate 102 adjacent to the gate 138 by implanting n-type dopants such as phosphorus and co-implant species such as carbon, followed by annealing the substrate 102.

The gate dielectric layer 112 of the low-voltage PMOS transistor 104 and the gate dielectric layer 136 of the low-voltage NMOS transistor 108 may be formed concurrently. The gate 114 of the low-voltage PMOS transistor 104, the gate 126 of the high-voltage PMOS transistor 106, and the gate 138 of the low-voltage NMOS transistor 108 may be formed concurrently. The gate oxidation 116 of the low-voltage PMOS transistor 104, the gate oxidation 128 of the high-voltage PMOS transistor 106, and the gate oxidation 140 of the low-voltage NMOS transistor 108 may be formed concurrently. The gate offset spacers 120 of the low-voltage PMOS transistor 104, the gate offset spacers 132 of the high-voltage PMOS transistor 106, and the gate offset spacers 144 of the low-voltage NMOS transistor 108 may be formed concurrently. The PLDD regions 122 of the low-voltage PMOS transistor 104 and the PLDD regions 134 of the high-voltage PMOS transistor 106 may be formed concurrently.

The low-voltage PMOS transistor 104 and the high-voltage PMOS transistor 106 are formed in n-type wells 148, possibly the same n-type well 148 as depicted in FIG. 1A, which was formed in the substrate 102 possibly after the field oxide 110. The low-voltage NMOS transistor 108 is formed in a p-type well 150 which was formed in the substrate 102 possibly after the field oxide 110.

A first layer 152 of the dual layer hard mask 154 is formed over an existing top surface of the integrated circuit 100, contacting the gate offset spacers 120 of the low-voltage PMOS transistor 104, the gate offset spacers 132 of the high-voltage PMOS transistor 106 and the gate offset spacers 144 of the low-voltage NMOS transistor 108. The first layer 152 is chlorine-containing silicon nitride formed by a plasma enhanced chemical vapor deposition (PECVD) process with a first chlorinated silane reagent, such as hexachlorodisilane, a hydrocarbon such as ethylene, and ammonia. The PECVD process for forming the first layer 152 may be performed at, for example, 550° C. to 650° C. The first layer 152 may be, for example, 4 nanometers to 10 nanometers thick.

Forming the first layer 152 with the hydrocarbon may advantageously provide a desired low wet etch rate of the first layer 152 in a subsequent removal process, so that at least a portion of the gate offset spacers 120 of the low-voltage PMOS transistor 104, the gate offset spacers 132 of the high-voltage PMOS transistor 106 and the gate offset spacers 144 of the low-voltage NMOS transistor 108 remains after the removal process.

Figure 1B:
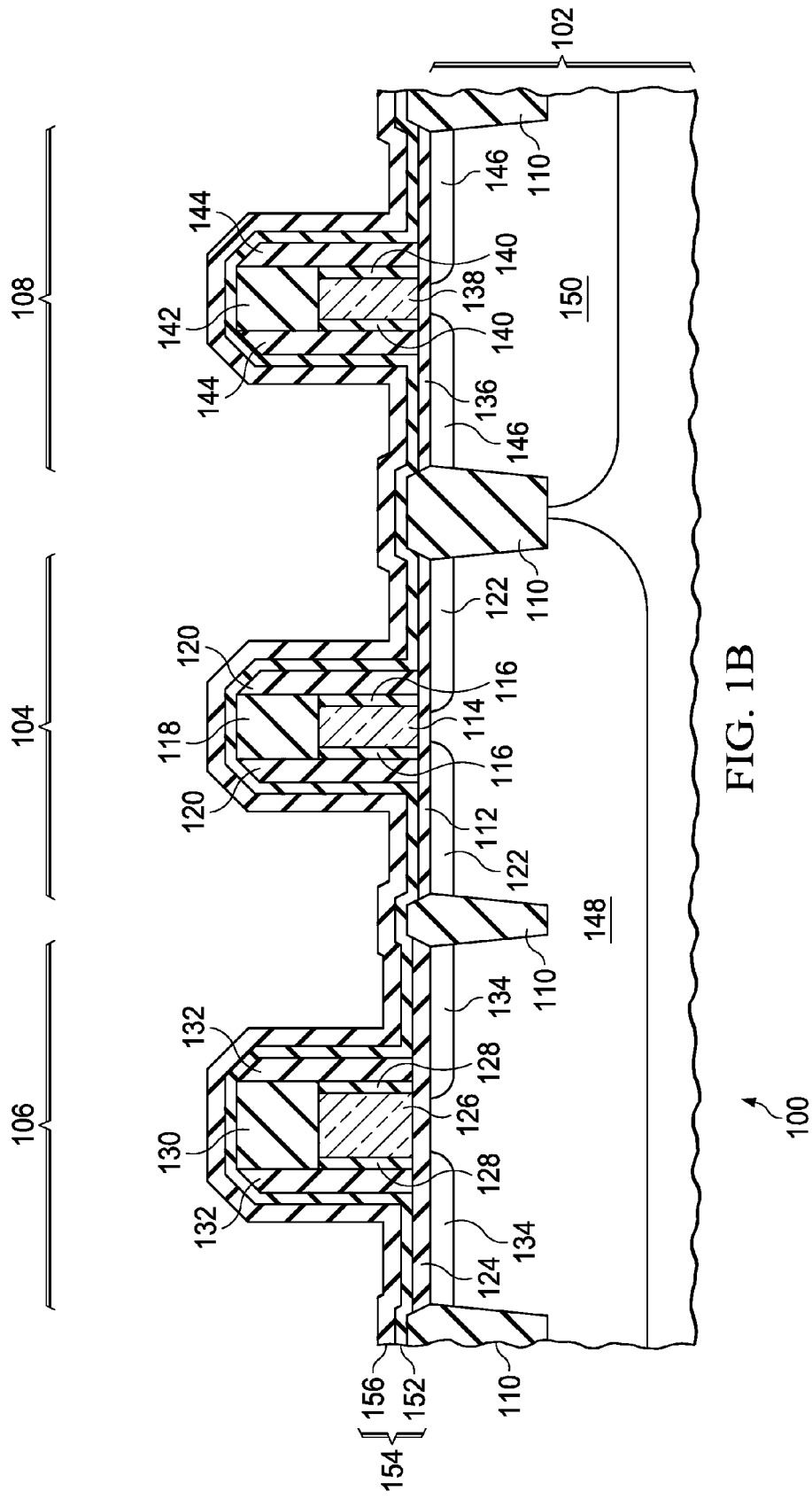

Referring to FIG. 1B, a second layer 156 of the dual layer hard mask 154 is formed on the first layer 152. The second layer 156 is silicon nitride formed by a PECVD process with a second chlorinated silane reagent, such as hexachlorodisilane, and ammonia, without a hydrocarbon reagent. The PECVD process for forming the second layer 156 may be performed at, for example, 550° C. to 600° C. The second layer 156 is 10 nanometers to 30 nanometers thick.

Forming the first layer 152 with the first chlorinated silane reagent and the second layer 156 with the second chlorinated silane reagent may advantageously provide a desired level of conformality in the dual layer hard mask 154, so that the thickness of the dual layer hard mask 154 on vertical surfaces, such as adjacent to the lateral surfaces of the gate offset spacers 120 of the low-voltage PMOS transistor 104, is at least 80 percent of the thickness of the dual layer hard mask 154 on proximate horizontal surfaces. Furthermore, forming the first layer 152 with the first chlorinated silane reagent and the second layer 156 with the second chlorinated silane reagent may advantageously provide a desired level of thickness uniformity across regions of the integrated circuit 100 with different densities of gates. For example, thicknesses of the dual layer hard mask 154 on vertical surfaces in dense regions such as an SRAM and in sparse regions such as isolated logic gates may be within 5 percent of each other, providing a desired uniformity of lateral separations between gates and SiGe epitaxial source/drain regions.

Figure 1C:
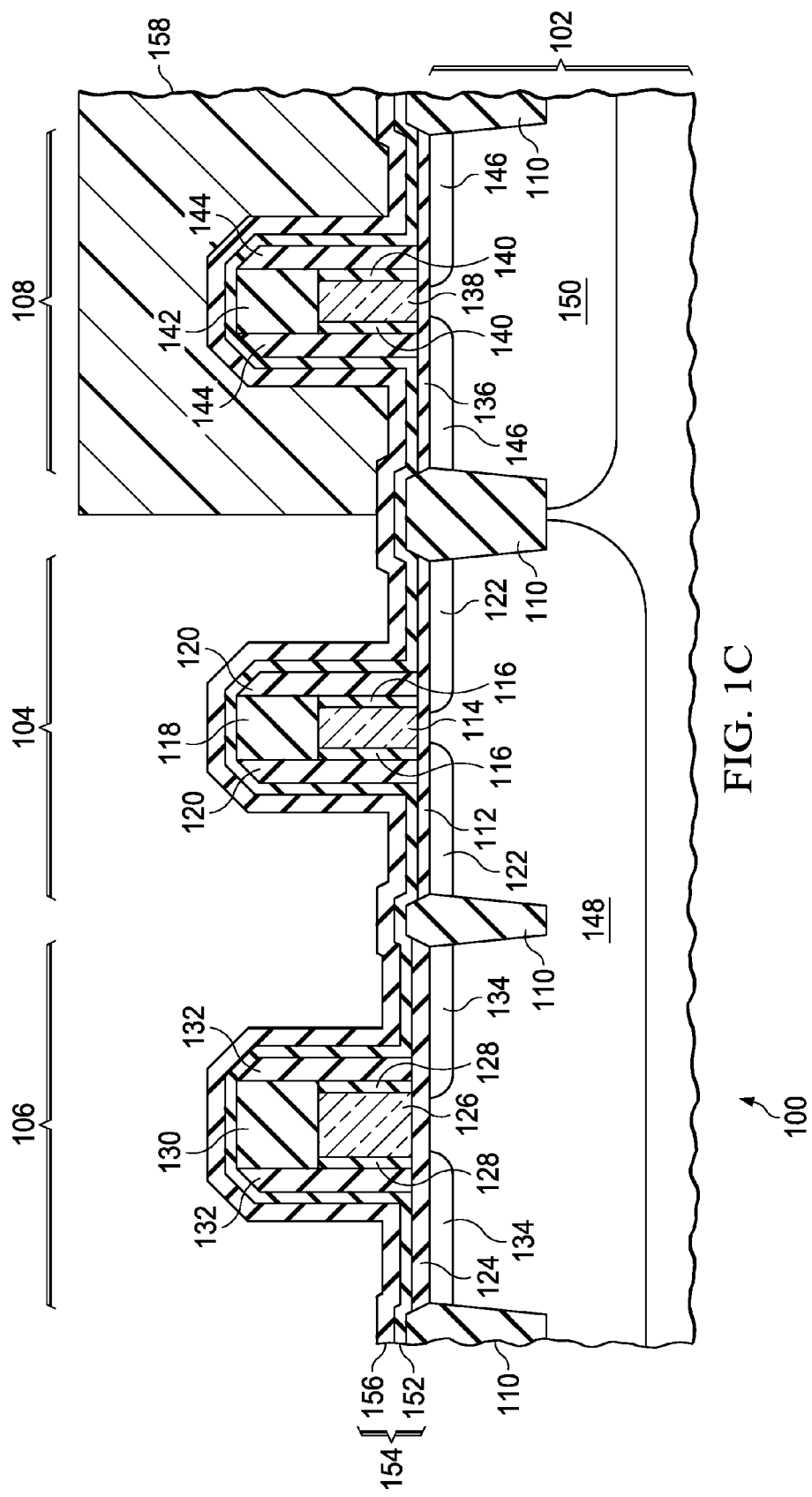

Referring to FIG. 1C, an etch mask 158 is formed over the integrated circuit 100 so as to expose areas for subsequent SiGe epitaxial layers, such as the low-voltage PMOS transistor 104 and possibly the high-voltage PMOS transistor 106, and to cover areas such as the low-voltage NMOS transistor 108 to be excluded from the SiGe epitaxial layers. The etch mask 158 may include photoresist formed by a photolithographic process.

Figure 1D:
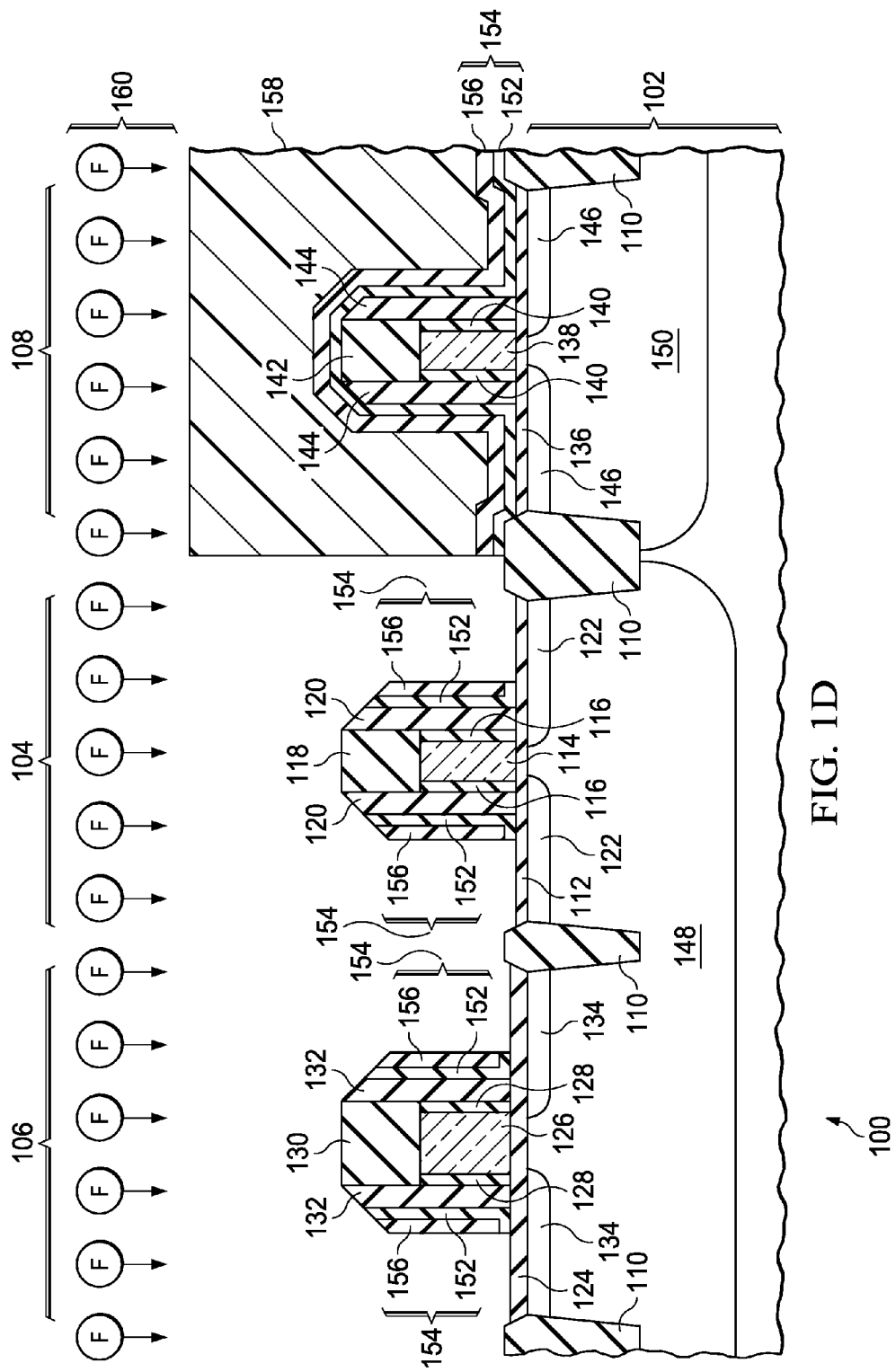

Referring to FIG. 1D, an anisotropic etch process 160 removes the second layer 156 and the first layer 152 from horizontal surfaces of the integrated circuit 100 which are exposed by the etch mask 158. The dual layer hard mask 154 remains on the lateral surfaces of the gate offset spacers 120 of the low-voltage PMOS transistor 104 and the gate offset spacers 132 of the high-voltage PMOS transistor 106. The anisotropic etch process 160 may include, for example, a reactive ion etch (RIE) process using fluorine radicals. The etch mask 158 is removed after the anisotropic etch process 160 is completed.

Figure 1E:
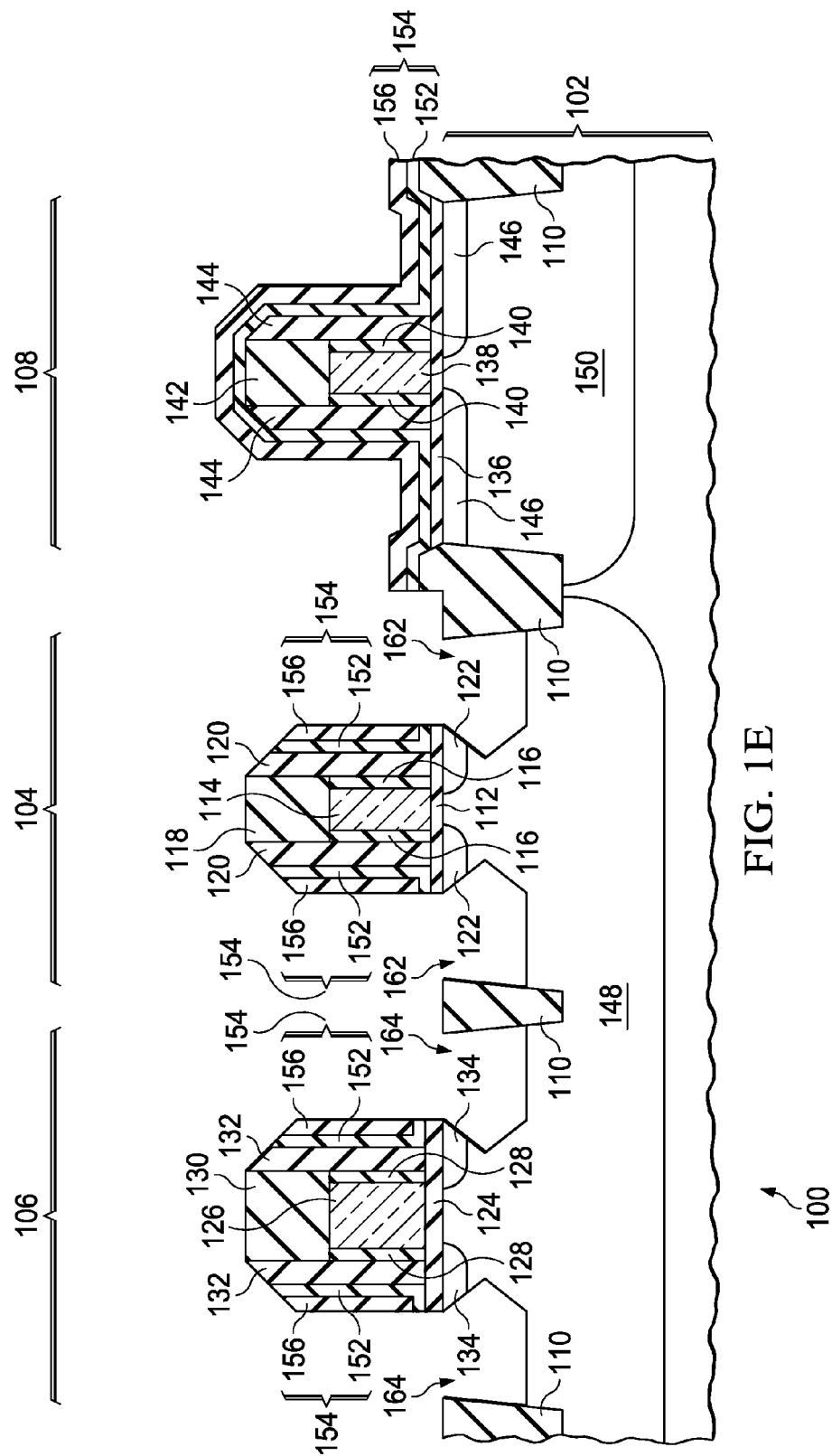

Referring to FIG. 1E, a source/drain etch process removes material from the substrate 102 in source/drain regions of the low-voltage PMOS transistor 104 to form source/drain cavities 162, and in source/drain regions of the high-voltage PMOS transistor 106 if exposed by the etch mask 158 to form source/drain cavities 164.

Figure 1F:
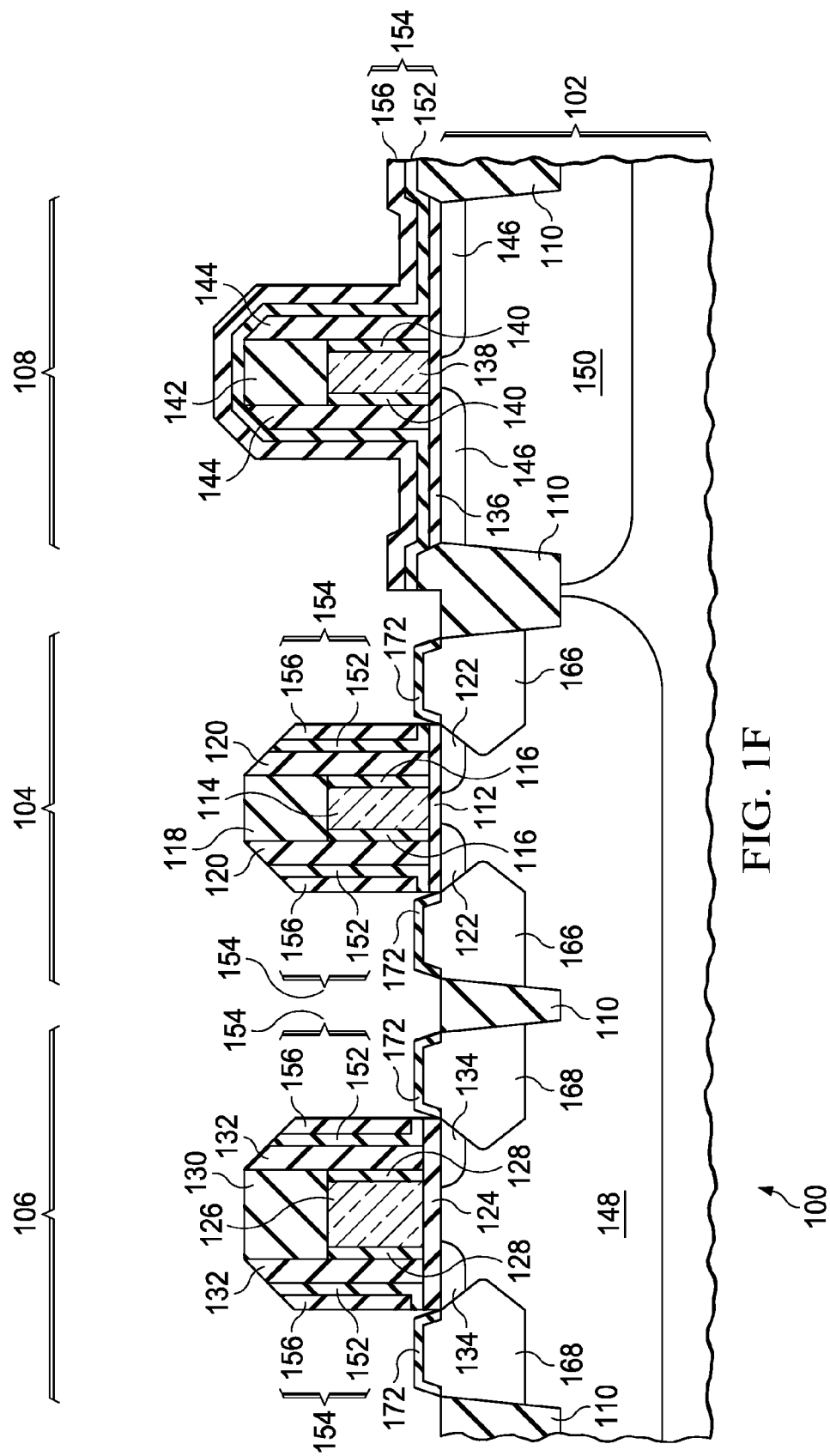

Referring to FIG. 1F, a silicon-germanium epitaxial process forms SiGe source/drain regions 166 in the source/drain cavities 162 of the low-voltage PMOS transistor 104, and concurrently forms SiGe source/drain regions 168 in the source/drain cavities 164, if present, of the high-voltage PMOS transistor 106. The SiGe source/drain regions 166 and 168 may have a germanium atomic fraction of 20 percent to 50 percent. The silicon-germanium epitaxial process may form silicon caps 170 on the SiGe source/drain regions 166 and 168.

Figure 1G:
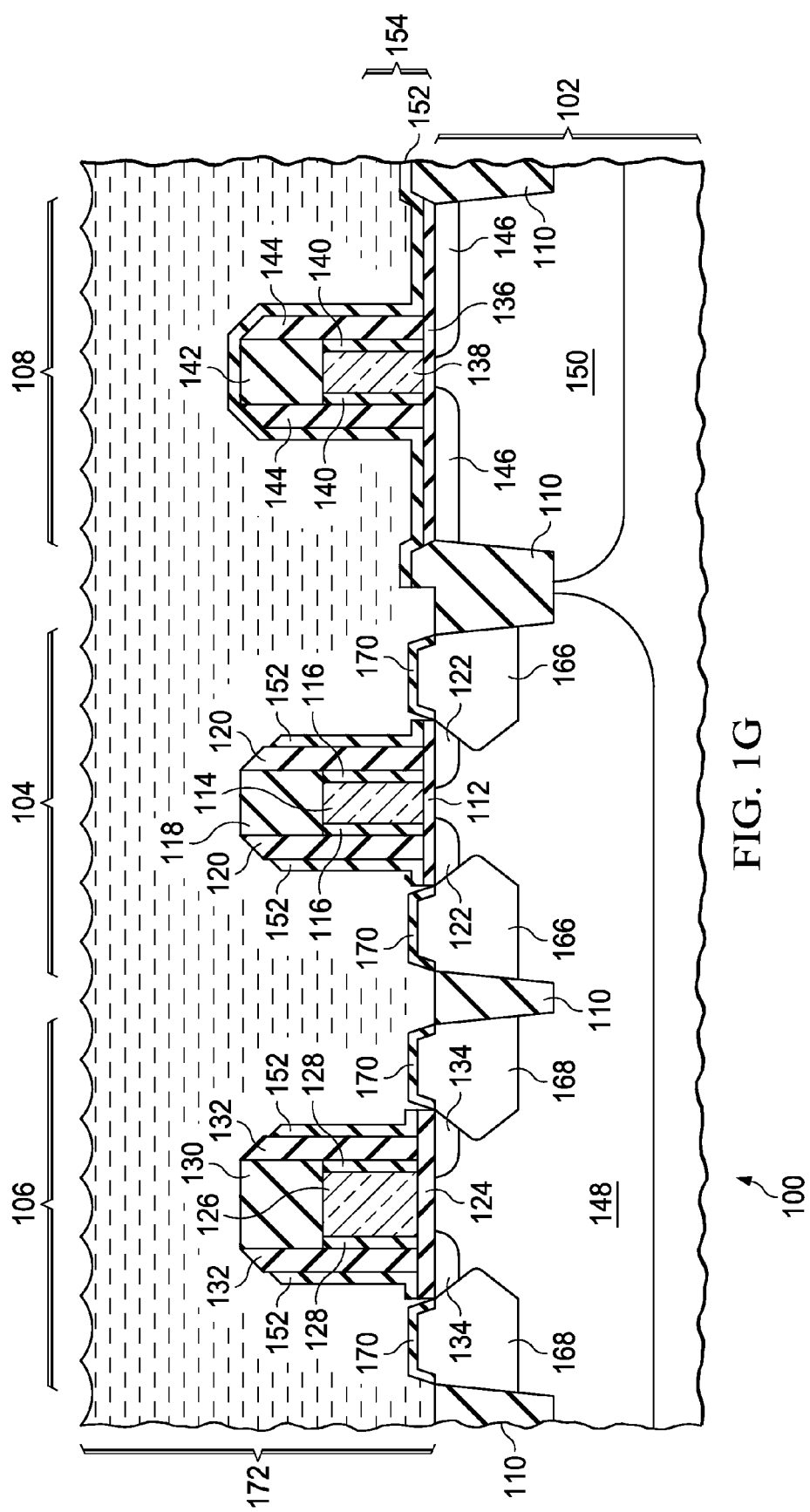

Referring to FIG. 1G, the integrated circuit 100 is exposed to a first phase of a wet etch process 172 which removes the second layer 156 of the dual layer hard mask 154. The first phase of the wet etch process 172 may include a phosphoric acid containing etch step at 150° C. to 160° C., for 30 seconds to 75 seconds. The phosphoric acid containing etch may be, for example, an aqueous seasoned phosphoric acid or an aqueous mixture of phosphoric acid and sulfuric acid.

The etch rate of the second layer 156 is at least three times faster than the etch rate of the first layer 152 in the first phase of the wet etch process 172, so that a majority portion of the first layer 152 remains in place after the first phase of the wet etch process 172 is completed.

Figure 1H:
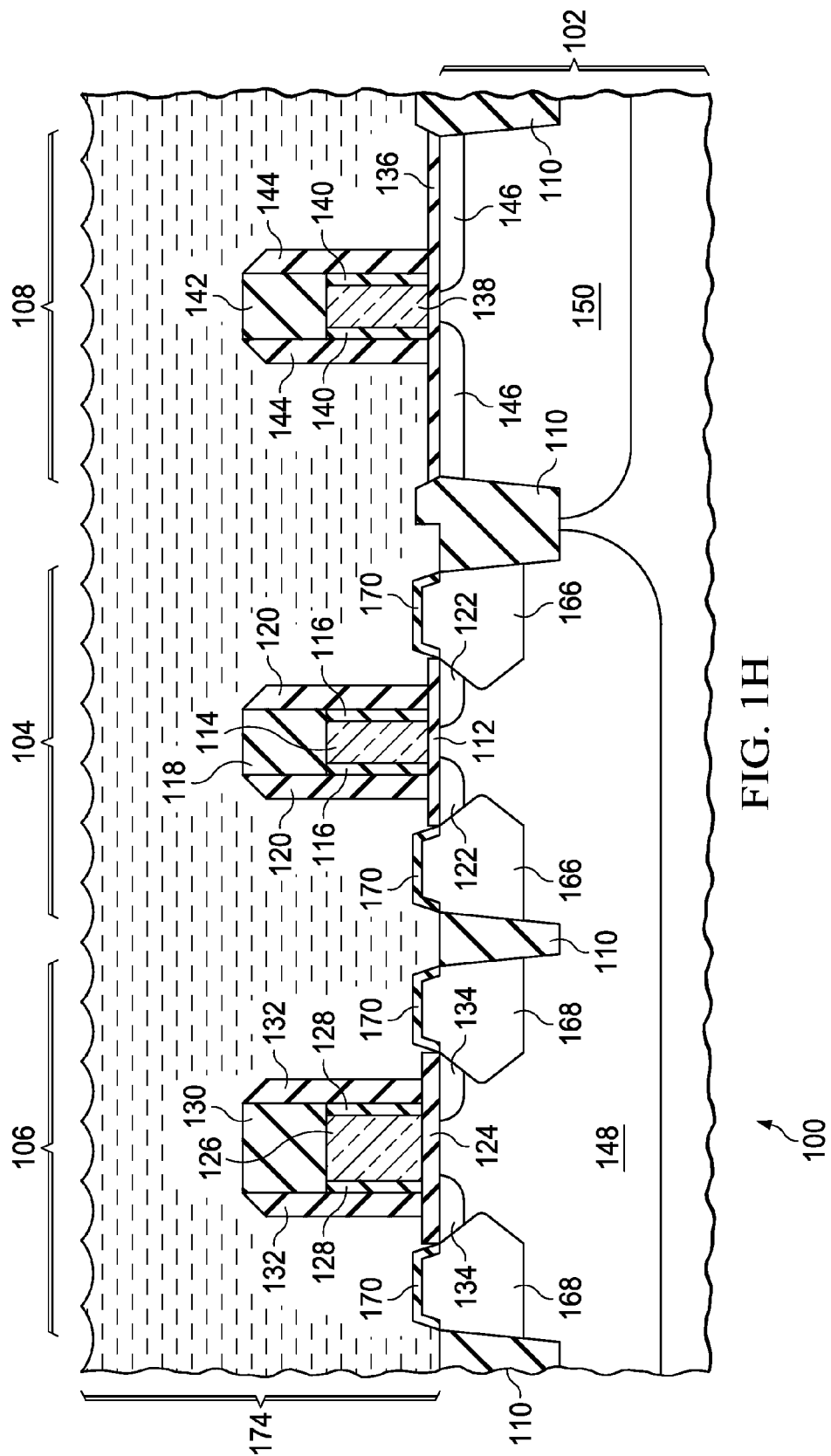

Referring to FIG. 1H, the integrated circuit 100 is exposed to a second phase of the wet etch process 172 which removes the first layer 152 of the dual layer hard mask 154. The second phase of the wet etch process 172 may be a continuation of the first phase of a wet etch process 172. An etch rate of the first layer 152 in the second phase of the wet etch process 172 may be, for example, 0.4 nanometers per minute to 0.8 nanometers per minute. The second phase of the wet etch process 174 is performed so that at least a portion of the gate offset spacers 120 of the low-voltage PMOS transistor 104, the gate offset spacers 132 of the high-voltage PMOS transistor 106, and the gate offset spacers 144 of the low-voltage NMOS transistor 108 remains after the second phase of the wet etch process 174 is completed. Forming the first layer 152 with the hydrocarbon reagent may advantageously provide an etch stop function so that integrity of the gate offset spacers 120, 132 and 144 is not compromised by the second phase of the wet etch process 172.

Fabrication of the integrated circuit 100 is continued, for example by forming gate sidewall spacers adjacent to the gate 114 of the low-voltage PMOS transistor 104, the gate 126 of the high-voltage PMOS transistor 106, and the gate 138 of the low-voltage NMOS transistor 108.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit, comprising the steps of:
    forming a first layer of a dual layer hard mask over a gate of a p-channel metal oxide semiconductor (PMOS) transistor, said first layer being silicon nitride formed by a plasma enhanced chemical vapor deposition (PECVD) process with a first chlorinated silane reagent, a hydrocarbon, and ammonia;
    subsequently, forming a second layer of said dual layer hard mask on said first layer, said second layer being chlorine-containing silicon nitride formed by a PECVD process with a second chlorinated silane reagent and ammonia and free of a hydrocarbon reagent;
    removing said second layer and said first layer from horizontal surfaces of said integrated circuit by an anisotropic etch, leaving said second layer and said first layer on lateral surfaces of gate offset spacers disposed on lateral surfaces of said gate of said PMOS transistor;
    subsequently removing material from a substrate of said integrated circuit to form source/drain cavities adjacent to said gate of said PMOS transistor;
    subsequently forming silicon-germanium (SiGe) source/drain regions in said source/drain cavities by an epitaxial process;
    subsequently removing said second layer by a first phase of a wet etch process in which an etch rate of said second layer is at least three times faster than an etch rate of said first layer; and
    subsequently removing said first layer by a second phase of said wet etch process, so that at least a portion of said gate offset spacers remains after said second phase of said wet etch process is completed.

2. The method of claim 1, in which said first chlorinated silane reagent is hexachlorodisilane.

3. The method of claim 1, in which said hydrocarbon is ethylene.

4. The method of claim 1, in which said first layer is formed at 550° C. to 650° C.

5. The method of claim 1, in which said first layer is 4 nanometers to 10 nanometers thick.

6. The method of claim 1, in which said second chlorinated silane reagent is hexachlorodisilane.

7. The method of claim 1, in which said second layer is formed at 550° C. to 600° C.

8. The method of claim 1, in which said second layer is 10 nanometers to 30 nanometers thick.

9. The method of claim 1, in which a thickness of said second layer on vertical surfaces of said integrated circuit is at least 80 percent of a thickness of said second layer on horizontal surfaces of said integrated circuit.

10. The method of claim 1, in which a thickness of said second layer on vertical surfaces in a static random access memory (SRAM) of said integrated circuit and a thickness of said second layer on vertical surfaces in a logic circuit of said integrated circuit are within 5 percent of each other.

11. The method of claim 1, in which said first phase of said wet etch process includes a phosphoric acid containing etch step.

12. The method of claim 11, in which said phosphoric acid containing etch step is performed at 150° C. to 160° C.

13. The method of claim 11, in which said phosphoric acid containing etch step is performed for 30 seconds to 75 seconds.

14. The method of claim 1, in which said second phase of said wet etch process is a continuation of said first phase of said wet etch process.

15. The method of claim 1, in which an etch rate of said first layer in said second phase of said wet etch process is 0.4 nanometers per minute to 0.8 nanometers per minute.

16. The method of claim 1, further comprising the step of forming an etch mask over said integrated circuit so as to expose said PMOS transistor and cover an n-channel metal oxide semiconductor (NMOS) transistor, performed after said step of forming said second layer and prior to said step of removing said second layer and said first layer from horizontal surfaces of said integrated circuit.

17. The method of claim 1, in which:
    said PMOS transistor is a low-voltage PMOS transistor;
    said integrated circuit includes a high-voltage PMOS transistor, in which a gate dielectric layer of said high-voltage PMOS transistor is at least 30 percent thicker than a gate dielectric layer of said low-voltage PMOS transistor;
    said first layer is formed over a gate of said high-voltage PMOS transistor;
    said step of removing said second layer and said first layer from horizontal surfaces of said integrated circuit leaves said second layer and said first layer on lateral surfaces of gate offset spacers disposed on lateral surfaces of said gate of said high-voltage PMOS transistor; and
    said step of removing material from said substrate of said integrated circuit also forms source/drain cavities adjacent to said gate of said high-voltage PMOS transistor.

18. A method of forming an integrated circuit, comprising the steps of:
    forming a first layer of a dual layer hard mask over a gate of a PMOS transistor and a gate of an NMOS transistor, said first layer being silicon nitride formed by a PECVD process with a first chlorinated silane reagent, a hydrocarbon, and ammonia;

subsequently, forming a second layer of said dual layer hard mask on said first layer, said second layer being chlorine-containing silicon nitride formed by a PECVD process with a second chlorinated silane reagent and ammonia and free of a hydrocarbon reagent;

forming an etch mask over said second layer of said dual layer hard mask so as to cover said NMOS transistor and expose said PMOS transistor;

removing said second layer and said first layer from horizontal surfaces of said integrated circuit by an anisotropic etch, leaving said second layer and said first layer on lateral surfaces of gate offset spacers disposed on lateral surfaces of said gate of said PMOS transistor, and leaving said second layer and said first layer over said NMOS transistor;

subsequently removing said etch mask;

subsequently removing material from a substrate of said integrated circuit to form source/drain cavities adjacent to said gate of said PMOS transistor;

subsequently forming SiGe source/drain regions in said source/drain cavities by an epitaxial process;

subsequently removing said second layer such that no portion of the second layer remains by a first phase of a wet etch process in which an etch rate of said second layer is at least three times faster than an etch rate of said first layer; and subsequently removing said first layer such that no portion of the first layer remains by a second phase of said wet etch process, so that at least a portion of said gate offset spacers remains after said second phase of said wet etch process is completed.

19. A method of forming an integrated circuit, comprising the steps of:

forming a first layer of a dual layer hard mask over a gate of a low-voltage PMOS transistor, a gate of a high-voltage PMOS transistor in which a gate dielectric layer of said high-voltage PMOS transistor is at least 30 percent thicker than a gate dielectric layer of said low-voltage PMOS transistor, and a gate of an NMOS transistor, said first layer being silicon nitride formed by a PECVD process with a first chlorinated silane reagent, a hydrocarbon, and ammonia;

forming a second layer of said dual layer hard mask on said first layer, said second layer being chlorine-containing silicon nitride formed by a PECVD process with a second chlorinated silane reagent and ammonia and free of a hydrocarbon reagent;

forming an etch mask over said second layer of said dual layer hard mask so as to cover said NMOS transistor and expose said high-voltage PMOS transistor and said low-voltage PMOS transistor;

removing said second layer and said first layer from horizontal surfaces of said integrated circuit by an anisotropic etch, leaving said second layer and said first layer on lateral surfaces of gate offset spacers disposed on lateral surfaces of said gate of said low-voltage PMOS transistor and said high-voltage PMOS transistor, and leaving said second layer and said first layer over said NMOS transistor;

subsequently removing said etch mask;

subsequently removing material from a substrate of said integrated circuit to form source/drain cavities adjacent to said gate of said low-voltage PMOS transistor and adjacent to said gate of said high-voltage PMOS transistor;

subsequently forming SiGe source/drain regions in said source/drain cavities by an epitaxial process;

subsequently removing said second layer by a first phase of a wet etch process in which an etch rate of said second layer is at least three times faster than an etch rate of said first layer; and subsequently removing said first layer by a second phase of said wet etch process, so that at least a portion of said gate offset spacers remains after said second phase of said wet etch process is completed.

* * * * *